United States Patent
Pickerd et al.

(10) Patent No.: US 9,933,458 B2
(45) Date of Patent: Apr. 3, 2018

(54) BAND OVERLAY SEPARATOR

(71) Applicant: Tektronix, Inc., Beaverton, OR (US)

(72) Inventors: John J. Pickerd, Hillsboro, OR (US); Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 399 days.

(21) Appl. No.: 14/674,344

(22) Filed: Mar. 31, 2015

(65) Prior Publication Data

US 2016/0291056 A1      Oct. 6, 2016

(51) Int. Cl.

| | |
|---|---|
| G05B 11/32 | (2006.01) |
| G01R 13/02 | (2006.01) |
| H03M 1/10 | (2006.01) |
| G01R 13/22 | (2006.01) |
| H03M 1/12 | (2006.01) |

(52) U.S. Cl.
CPC ..... *G01R 13/0218* (2013.01); *G01R 13/0272* (2013.01); *G01R 13/225* (2013.01); *H03M 1/1052* (2013.01); *H03M 1/1215* (2013.01)

(58) Field of Classification Search
CPC .............. A61K 2300/00; A61K 31/075; A61K 31/185; A61K 31/41; A61K 31/55; A61K 31/56; A61K 31/575; A61K 31/685; A61K 31/7056; A61K 36/286; A61K 36/355; A61K 36/42; A61K 36/68; A61K 38/21
See application file for complete search history.

(56) References Cited

U.S. PATENT DOCUMENTS

| | | |
|---|---|---|
| 7,257,497 B2 | 8/2007 | Pickerd |
| 7,474,972 B2 | 1/2009 | Pickerd et al. |
| 8,463,224 B2 | 6/2013 | Pickerd et al. |
| 8,588,703 B2 | 10/2013 | Pickerd et al. |
| 2007/0080835 A1 | 4/2007 | Maeda et al. |

(Continued)

FOREIGN PATENT DOCUMENTS

EP          2528235 A2      11/2012

OTHER PUBLICATIONS

Knierim, Dan: "Ultra-Wide-Bandwidth Oscilloscope Architectures and Circuits", 2014 IEEE Bipolar/Bicmos Circuits and Technology Meeting, IEEE, Sep. 28, 2014, pp. 136-142, XP032700851.

(Continued)

*Primary Examiner* — Robert Bachner
(74) *Attorney, Agent, or Firm* — Marger Johnson; Kevin Dothager (57) ABSTRACT

A test and measurement instrument including a splitter configured to split an input signal into at least two split signals, at least two harmonic mixers configured to mix an associated split signal with an associated harmonic signal to generate an associated mixed signal, at least two digitizers configured to digitize the associated mixed signal, at least two MIMO polyphase filter arrays configured to filter the associated digitized mixed signal of an associated digitizer of the at least two digitizers, at least two pairs of band separation filters configured to receive the associated digitized mixed signals from each of the MIMO polyphase filter arrays and output a low band of the input signal and a high band of the input signal based on a time different between the at least two digitizers and a phase drift of a local oscillator, and a combiner configured to combine the low band of the input signal and the high band of the input signal to form a reconstructed input signal.

14 Claims, 8 Drawing Sheets

(56) References Cited

U.S. PATENT DOCUMENTS

2012/0299579 A1 10/2012 Knierim
2014/0354344 A1 12/2014 Knierim et al.

OTHER PUBLICATIONS

Shahrzad Jalali Mazlouman et al.: "Digital Compensation Techniques for Frequency Translating Hybrid Analog-to-Digital Converters", IEEE Transactions on Instrumentation and Measurement, IEEE Service Center, vol. 60, No. 31, Mar. 1, 2011, pp. 758-767.
Hotz Matthias et al.: "Block Processing with Iterative Correction Filters for Time-Interleaved ADCs", 2014 IEEE International Conference on Acoustics, Speech and Signal Processing, May 4, 2014, pp. 4923-4932, XP032617215.
European Search Report and Written Opinion for EP Application No. 16163396.1, dated Jun. 29, 2016, 15 pages.

BAND OVERLAY SEPARATOR

TECHNICAL FIELD

This disclosure relates to test and measurement instruments and, more particularly, to test and measurement instruments including one or more asynchronous time-interleaved digitizers, which use harmonic mixing for reducing noise.

BACKGROUND

Useable bandwidths of test and measurement instruments, such as digital oscilloscopes, can be limited by an analog-to-digital converter (ADC) used to digitize input signals. The useable bandwidth of an ADC can be limited to the lesser of the analog bandwidth or one half of a maximum sample rate of the ADC. Various techniques have been developed to digitize higher bandwidth signals with existing ADCs.

For example, synchronous time-interleaving can be used to achieve an effective higher sample rate. Multiple ADCs can sample an input signal offset in time within a single sample period. The digitized outputs can be combined together for an effectively multiplied sample rate. However, if the analog bandwidth of the ADCs become the limiting factor, a high bandwidth front end, such as a multi-way interleaved track and hold amplifier is needed to achieve a higher bandwidth.

Conventional track-and-hold amplifier-based time-interleaved systems cause the track-and-hold amplifier to be clocked at a sample rate similar to or slower than the ADC channel bandwidth so that the ADC will have sufficient time to settle to the held value. The ADC is synchronously clocked to the track-and-hold amplifier to digitally capture each held value. Such a limitation on the track-and-hold amplifier in turn limits the ADC sample rate. Moreover, to satisfy the Nyquist sampling theorem, the ADC sample rate is lowered to less than twice the bandwidth of the ADC channel. As a result, many time-interleaved ADC channels are needed to achieve the desired performance.

As the number of ADC channels increases, the overall cost and complexity of the system also increases. For instance, the front end chip must now drive more ADC channels, including additional ADC circuitry, clocking circuitry, or the like, to get the overall net sample rate up to a suitable value. The size and complexity of the chip also results in longer communication paths, and therefore, an increase in parasitic capacitance, electromagnetic noise, design difficulties, and so forth.

In another technique, sub-bands of an input signal can be downconverted to a frequency range that can be passed through a lower sample rate ADC. In other words, the wide input bandwidth can be split into multiple lower-bandwidth ADC channels. After digitization, the sub-bands can be digitally upconverted to the respective original frequency ranges and combined into a representation of the input signal. One significant disadvantage of this technique is the inherent noise penalty when digitizing an arbitrary input signal whose frequency content may be routed to only one ADC channel. The recombined output will contain signal energy from only one ADC, but noise energy from all ADCs, thereby degrading the Signal-to-Noise Ration (SNR).

Embodiments of the invention address these and other limitations in the prior art.

SUMMARY

Certain embodiments of the disclosed technology include a test and measurement instrument including a splitter configured to split an input signal into at least two split signals, each split signal including substantially the entire bandwidth of the input single; at least two harmonic mixers, each harmonic mixer configured to mix an associated split signal of the at least two split signals with an associated harmonic signal to generate an associated mixed signal; at least two digitizers, each digitizer configured to digitize the associated mixed signal of an associated harmonic mixer of the at least two harmonic mixers; at least two multiple input multiple output polyphase filter arrays, each multiple input multiple output polyphase filter array configured to filter the associated digitized mixed signal of an associated digitizer of the at least two digitizers; at least two pairs of band separation filters configured to receive the associated digitized mixed signals from each of the multiple input multiple output polyphase filter arrays and output a low band of the input signal and a high band of the input signal based on a time different between the at least two digitizers and a phase drift of a local oscillator; an interpolator configured to interpolate each of the high band and the low band; a mixer configured to mix the interpolated high band to restore the high band to its original frequency; and a combiner configured to combine the interpolated low band of the input signal and the interpolated high band of the input signal to form a reconstructed input signal.

Certain embodiments of the disclosed technology include a method including splitting an input signal into at least two split signals, each split signal including substantially the entire bandwidth of the input single; mixing each split signal with an associated harmonic signal to generate an associated mixed signal, digitizing each of the associated mixed signals; filtering each digitized mixed signal through an associated multiple input multiple output polyphase filter array; filtering by at least two pairs of band separation filters the digitized mixed signal from each of the multiple input multiple output polyphase filter array based on a time different between the at least two digitizers and a phase drift of a local oscillator; outputting from the at least two pairs of band separation filters a low band of the input signal and a high band of the input signal; interpolating each of the high band and the low band; mixing the interpolated high band to restore the high band to its original frequency; and combining the interpolated low band of the input signal and the interpolated high band of the input signal to form a reconstructed input signal.

DETAILED DESCRIPTION

In the drawings, which are not necessarily to scale, like or corresponding elements of the disclosed systems and methods are denoted by the same reference numerals.

Figure 1:
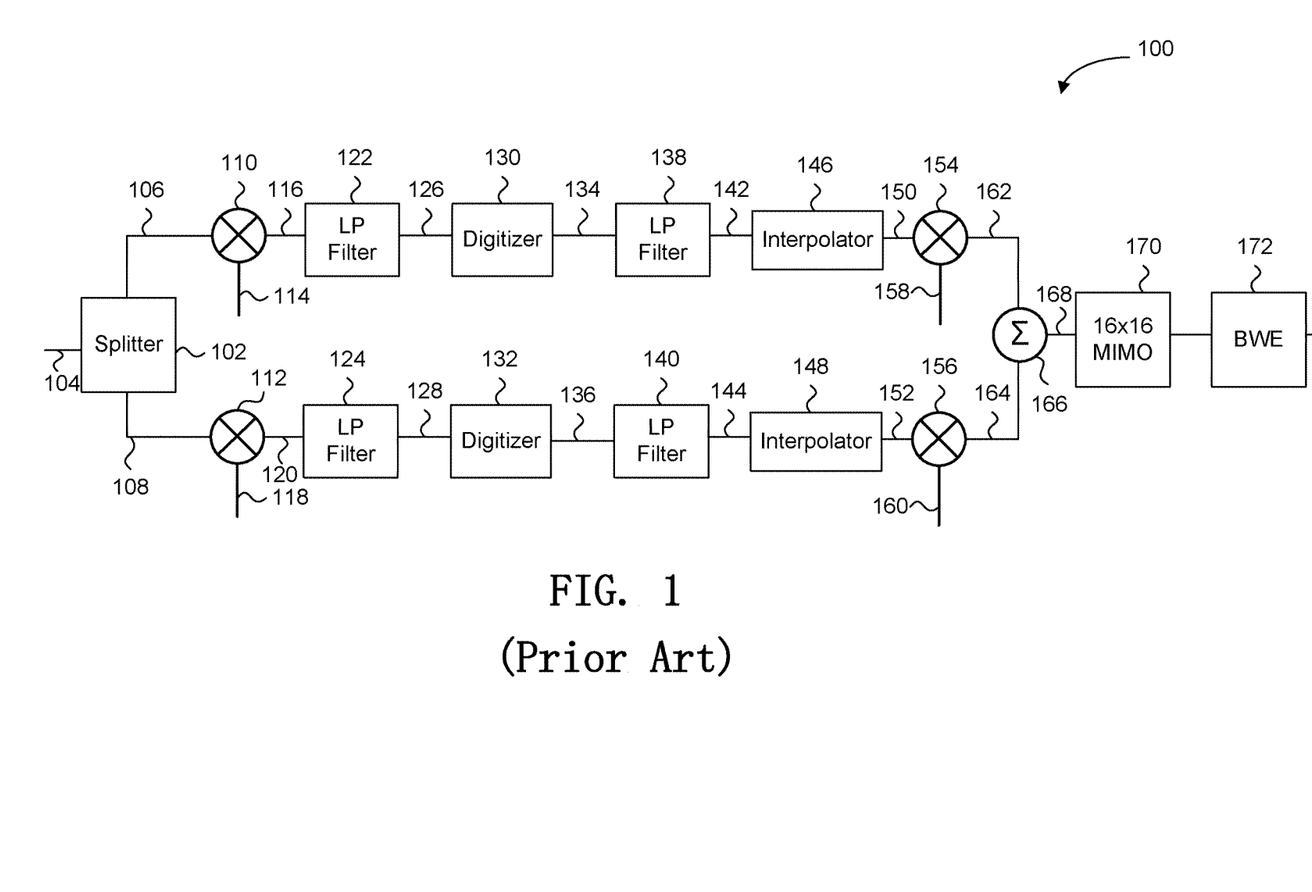
FIG. 1 is a block diagram of a prior art ADC system using harmonic mixers.

FIG. 1 is a block diagram of a prior art ADC system for a test and measurement instrument using harmonic mixing. In this system, the test and measurement instrument 100 includes a splitter 102 configured to split an input signal 104 having a particular frequency spectrum into multiple split signals 106 and 108, each split signal including substantially the entire spectrum of the input signal 104. A splitter 102 can be any variety of circuitry that can split the input signal 104 into multiple signals. For example, the splitter 104 may be a resistive divider. Thus, substantially all frequency components of the input signal 104 can be present in each split signal 106 and 108. However, depending on the number of paths, harmonic signals used, or the like, the frequency responses for various split signals of a splitter 102 can be different.

The split signals 106 and 108 are inputs to harmonic mixers 110 and 112, respectively. Harmonic mixer 110 is configured to mix the split signal 106 with a harmonic signal 114 to generate a mixed signal 116. Similarly, harmonic mixer 112 is configured to mix the split signal 108 with a harmonic signal 118 to generate a mixed signal 120.

As used herein, a harmonic mixer is a device configured to mix a signal with multiple harmonics. Although multiplication and/or mixing has been described in connection with harmonic mixing, as will be described in further detail below, a device that has the effect of multiplying a signal with multiple harmonics can be used as a harmonic mixer.

The harmonic signal 114 can be a signal represented by equation $1+2\cos(2\pi ft)$ and harmonic signal 118 can be a signal represented by $1-2\cos(2\pi ft)$. Here f represents the first-order harmonic and t represents time. Thus, the harmonic signal 114 has harmonics at DC and at frequency f.

Similar to harmonic signal 114, harmonic signal 118 has harmonics at DC and frequency f. However, the first-order harmonic at frequency f is out of phase by 180 degrees relative to the similar first-order harmonic in harmonic signal 114. Harmonic signals 114 and 118 are produced by local oscillators (LOs).

Mixed signals 116 and 120 are sent to lowpass filters 122 and 124, respectively. The outputs 126 and 128 of the lowpass filters 122 and 124, respectively, are sent to digitizers 130 and 132, respectively. Digitizer 130 is configured to digitize mixed signal 126. Similarly, a digitizer 132 is configured to digitize mixed signal 128. The digitizers 130 and 132 can be any variety of digitizer. Although not illustrated, each digitizer 130 and 132 can have a preamplifier, filter, attenuator, and other analog circuitry as needed. Thus, the mixed signal 126 input to the digitizer 130, for example, can be amplified, attenuated, or otherwise filtered before digitization.

The digitizers 130 and 132 are configured to operate at an effective sample rate. In some embodiments, the digitizer 130 can include a single analog to digital converter (ADC). However, in other embodiments, the digitizer 130 can include multiple interleaved ADCs operating at lower sample rates to achieve a higher effective sample rate.

A first-order harmonic of at least one of the harmonic signals 114 and 118 is different from an effective sample rate of at least one of the digitizers 130 and 132. For example, the first-order harmonic f of the harmonic signal 114 could be 75 GHz. A sample rate of the digitizer 130 could be 100 GS/s. Thus, the first-order harmonic f is different from the effective sample rate.

Synchronous lowpass filters 138 and 140 are configured to filter the digitized mixed signal 134 from digitizer 130 and digitized mixed signal 136 from digitizer 132, respectively. The filtered signals 142 and 144 are interpolated through interpolators 146 and 148, respectively. Then, harmonic mixers 154 and 156 are configured to mix the interpolated mixed signals 150 and 152 with harmonic signals 158 and 160, respectively. While the harmonic signals 114 and 118 are analog signals, and the harmonic signals 158 and 160 are digital signals, the scaling factors for these harmonic signals can be the same or similar to each other. A summer or combiner 166 is configured to combine the remixed signals 162 and 164 into a signal 168. Signal 168 is then processed through a 16×16 multiple input multiple output (MIMO) polyphase filter array 170. The waveform then is processed through a bandwidth enhance (BWE) filter 172 and the reconstructed output waveform is outputted.

The system of FIG. 1 results in directly passing the low band overlaid on an aliased high band on both digitizers 130 and 132. Each digitizer 130 and 132 uses standard 8-way interleave, causing the system to look and behave like a virtual 16-way interleave in the final reconstructed signal. Thus, the 16×16 MIMO 170 is used to operate on 16 virtual pipes to correct phase and magnitude errors and minimize spurs in the final output waveform.

Figure 2:
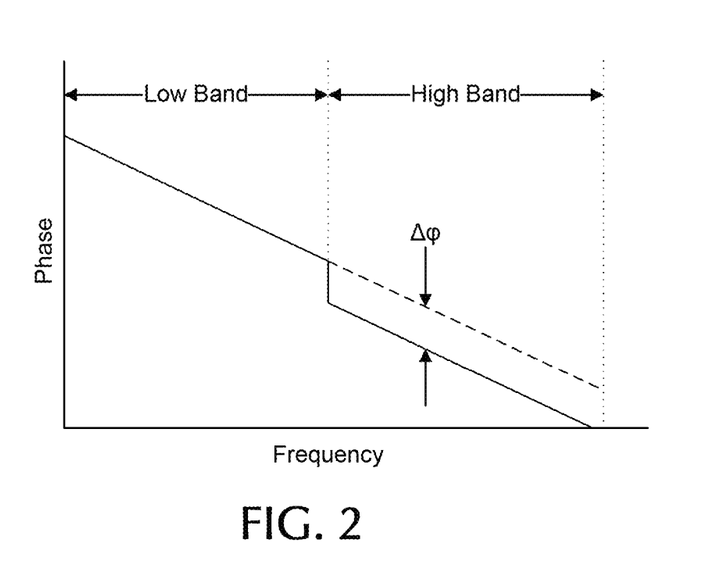
FIG. 2 is a graph showing the effect of a local oscillator (LO) delay on the phase response.

However, any change in phase due to temperature of hardware LOs by θ degrees will result in the aliased high band in the mixer output shifting by θ degerees at every frequency while the non-aliased band does not shift. This can be seen, for example, in FIG. 2. The high band phase drifts as the LO phase drifts by a constant angle at all frequencies. For example, a 5 degree drift of LO will cause Δφ to equal 5 degrees at each band frequency.

Figure 3:
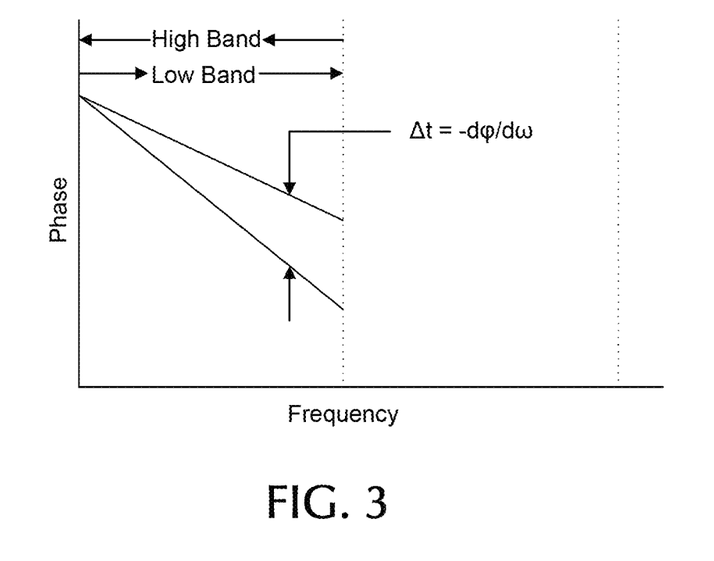
FIG. 3 is a graph showing the time delay difference between two digitizers.

FIG. 3 illustrates a constant time delay, Δt, that results from drift in the clocks of the two 8-way digitizers 130 and 132. The constant time delay, Δt, effects the phase response as seen in FIG. 3.

When the phase of an LO shifts, the phase shifts the virtual pipe phases of the high band only and the MIMO 170 is then no longer properly aligned. This results in spurs appearing in the final output waveform.

Figure 4:
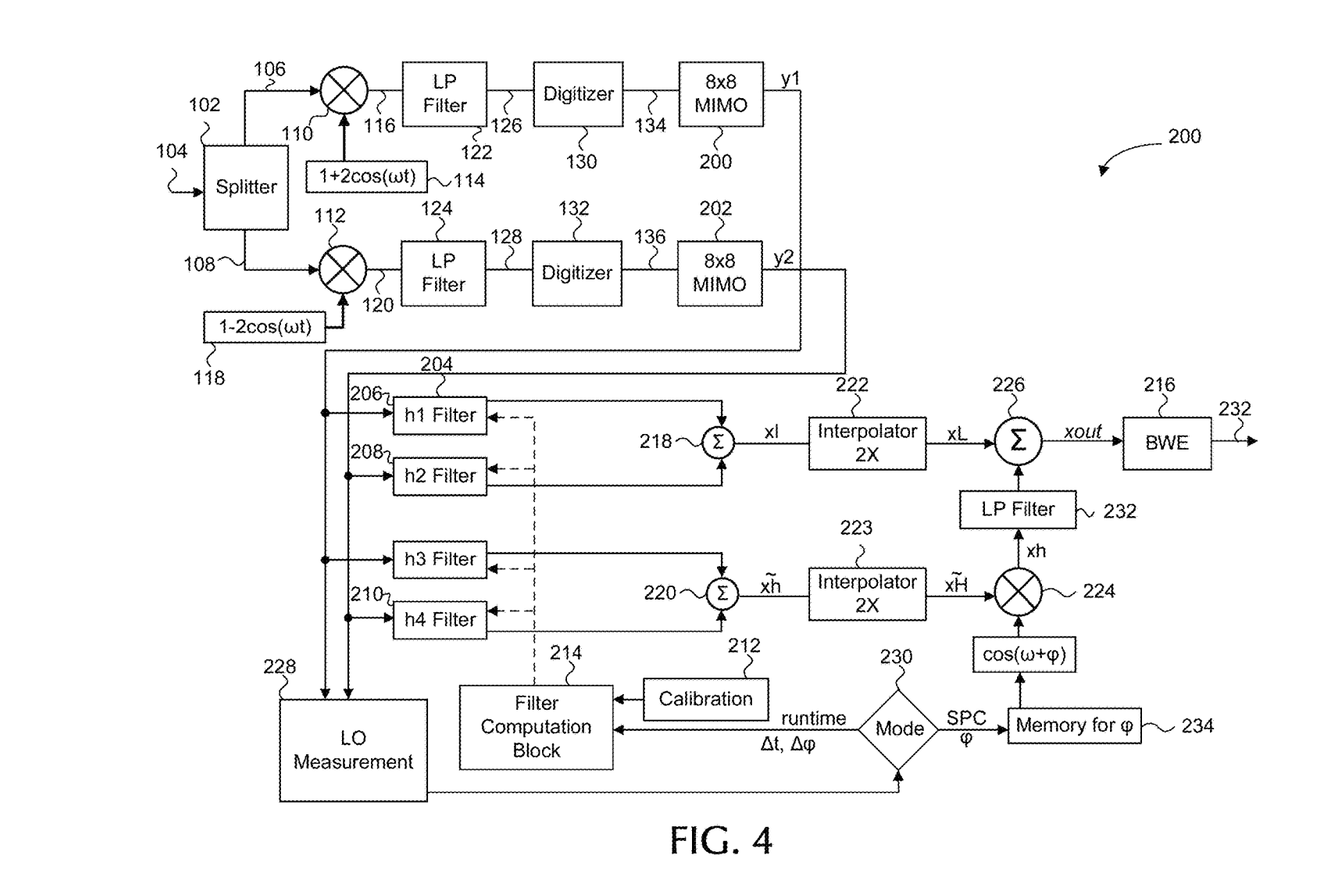
FIG. 4 is a block diagram of an ADC system using harmonic mixers according to embodiments of the disclosed technology.

FIG. 4 illustrates an asynchronous time interleave system with band overlay separator architecture according to embodiments of the disclosed technology. Embodiments of the disclosed technology allow the high band signal to be phase corrected without affecting the low band. In addition, the system moves the MIMO 200, 202 to a position prior to reconstruction of the signal, where spurs from the individual digitizers 130, 132 have already been corrected. Thus, the process corrects phase and magnitude at a lower sample rate prior to interpolation. This arrangement results in significantly lower computation requirements for the signal reconstruction.

In addition, the output of the band separation filters 204, 206, 208, and 210 are already phase and magnitude corrected prior to a bandwidth enhancement (BWE) filter, discussed in more detail below. Thus, the BWE filter 216 at 200 GS/s and 4 k sample length can be reduced significantly and just focus on correcting the signal in the crossover region between the high and low band. That is, the BWE filter can be reduced from 4,000 sample length to about 11 sample length. Further, the length of the MIMO filters 200, 202, also discussed in more detail below, are reduced from 256 to 128. This reduction results in the system of FIG. 4, described in more depth below, operating at about 0.78 the speed of the system of FIG. 1.

The ATI system of FIG. 4 includes the same components discussed above in FIG. 1 but differently arranged. That is, the input signal 104 is received at a signal splitter 102 and split into two paths 106 and 108. Each signal in each path 106 and 108 is fed to a mixer 110 and 112, respectively. Mixer 110 also receives a 1+2 cos(ωt) signal from a local oscillator (not shown) and mixer 112 receives a 1-2 cos(ωt) signal from the local oscillator. The mixed signals 116 and 120 are each sent to low pass filters 122 and 124, respectively, and digitizers 130 and 132, respectively.

However, in FIG. 4, the output from each digitizer is fed into an 8×8 MIMO 200 and 202 rather than adding the signals back together and inputting them into a 16×16 MIMO 170, as shown in FIG. 1. Each 8×8 MIMO 200 and 202 corrects the phases of the 8 pipes located in each digitizer 130 and 132, so that the digitizer output waveform pipes are corrected for mismatch. Each 8×8 MIMO 200 and 202 may also correct the magnitude response of the pipes.

Figure 5:
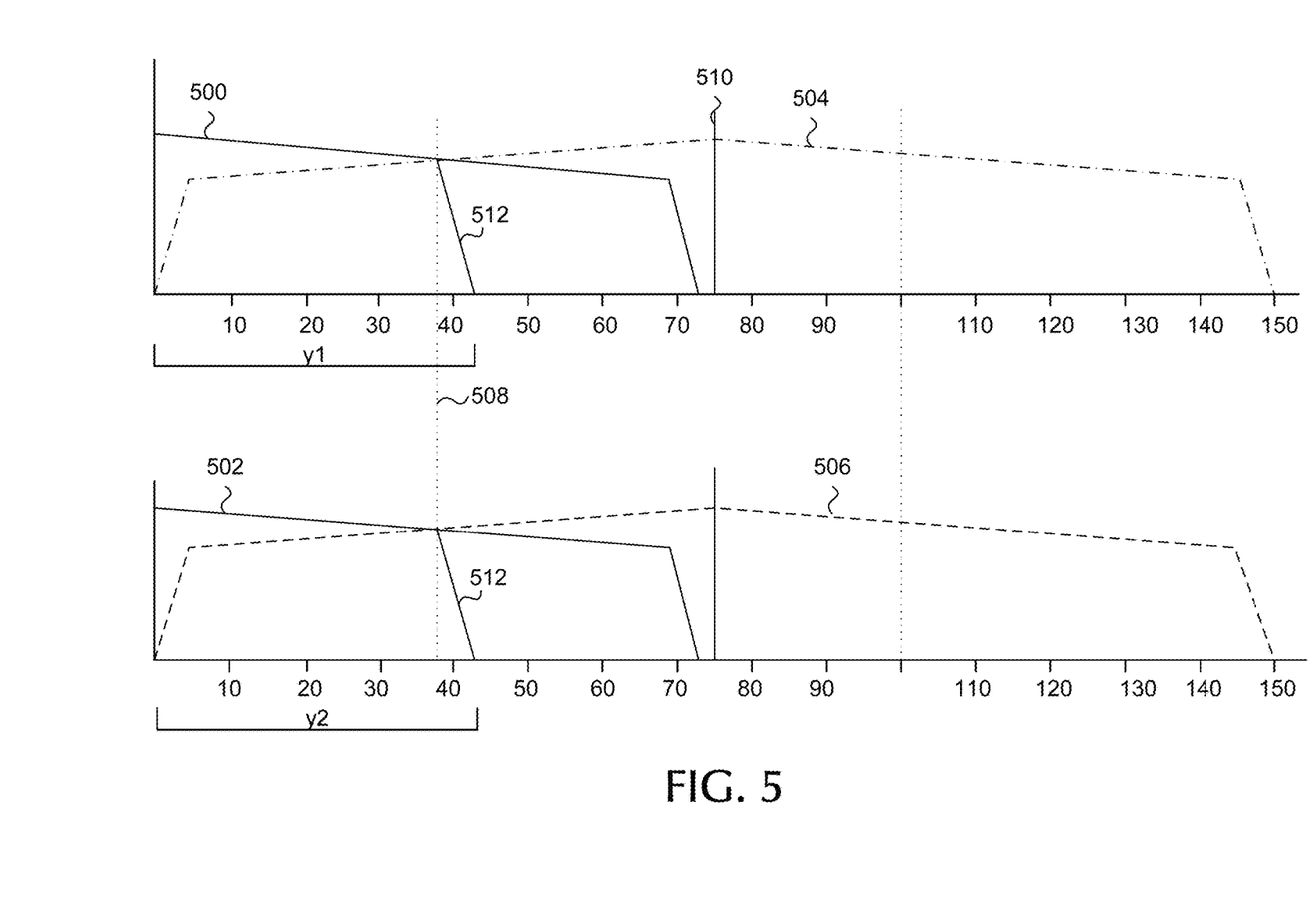
FIG. 5 is a graph that illustrates the output spectrums from the digitizers after being corrected.

FIG. 5 illustrates the y1 and y2 output spectrums from digitizers 130 and 132 after being corrected by the 8×8 MIMO filter blocks. The digitizer outputs contain the low band 500 and 502 for digitizers 130 and 132, respectively. The aliased high band 504 is shown for digitizer 130 and for digitizer 132, the aliased high band 506 is 180 degrees out of phase with respect to the aliased high band 504. The 37.5 GHz crossover region is shown at 508 and the 75 GHz LOs are shown at 510. 512 indicates the bandwidth limit.

Since both digitizers 130, 132 contain the full bandwidth of the original input signal overlaid, a solution is needed to separate the signals. This can be done using embodiments of the disclosed technology, as discussed in more detail below.

The 8×8 MIMOs 200, 202 are calibrated by using a sine wave generator (not shown). The sine wave generator is connected to two resistor splitters with the oscilloscope ATI input on one side and a power meter on the other side. The measurements for the harmonic positions are collected, as required. The array of filters can then be computed, using known methods.

The output y1 and y2 of each 8×8 MIMO 200 and 204 is sent to two sets of filters, h1 filter 204, h2 filter 206 and h3 filter 208, h4 filter 210, which will be discussed in more detail below. A calibration block 212 stores the H11, H12, H21, and H22 transfer function parameters needed to compute the h1, h2, h3, and h4 band separation and equalizer filters 204, 206, 208, and 210. These transfer function parameters are measured at the time of manufacture and stored in the calibration block 212. This is done at the time of manufacture. The calibration and measurement of H11, H12, H21, and H22 will be discussed in further detail below, with reference to FIG. 8.

A filter computation algorithm block 214 for the band separation filters 204, 206, 208, and 210 receives the measured values from the calibration block 212 of the transfer functions H11, H12, H21, and H22, and receives the measured phase, cp, of the LO drift, the time delay, Δt, between the two digitizers 130 and 132, and a crossover band shaping filter (not shown). This filter computation algorithm block 214 then computes the filter coefficients h1, h2, h3, and h4 for the band separation filters 204, 206, 208, and 210. To calculate h1, h2, h3, and h4 using H11, H12, H21, and H22 transfer function parameters, the input signal 104 is represented as xL+xh where xL is the low frequency band and xh is the high frequency band. In this example, the crossover frequency of the system is 37.5 GHz. When the mixers 110 and 112 down convert the high band to alias into the low band frequency range, the system has different overall transfer functions for the high band as compared to the low band.

Therefore, four different transfer functions HT1, HT2, HT3, and HT4 are defined to represent portions of the two ATI channel paths.

HT1 is the frequency domain transfer function from the input of the ATI channel to mixer 110 in FIG. 4 with a zero degree local oscillator phase. HT1 is split into two parts, HT1L and HT1h, which are the low band and high band parts, respectively. HT2 is the frequency domain transfer function from the input of the ATI channel to mixer 112 with a 180 degree local oscillator phase. HT2 is also split into two parts, HT2L and HT2h, which are the low band and high band parts, respectively. HT3 is the frequency domain transfer function from the output of mixer 110 to the output of the 8×8 MIMO 200. HT4 is the frequency domain transfer function from the output of mixer 112 to the output of the 8×8 MIMO 202.

Then, four additional transfer functions H11, H12, H21, and H22 are defined, which represent the four different transfer functions seen by the input signal 104, xL and xh.

$$H11(\omega) = HT1L(\omega) \cdot HT3(\omega) \tag{1}$$

$$H12(\omega) = HT1h(\omega_0 - \omega) \cdot e^{j \cdot \Delta\varphi} \cdot HT3(\omega) \tag{2}$$

$$H21(\omega) = HT2L(\omega) \cdot HT4(\omega) \cdot e^{j \cdot \omega \cdot \Delta t} \tag{3}$$

$$H22(\omega) = HT2h(\omega_0 - \omega) \cdot e^{j \cdot \Delta\varphi} \cdot HT4(\omega) \cdot e^{j \cdot \omega \cdot \Delta t} \tag{4}$$

$\omega_0$ represents the frequency of the LO and $\omega_0 - \omega$ represents the reverse frequency aliasing of the high band as it leaves the IF output of the mixers. The phase correction values are Δt and Δφ, as described in FIGS. 2 and 3 above.

The hardware digitizer clocks may drift with respect to each other or the LO may drift with respect to the sample clocks. Since the two mixers 110 and 112 are on the same integrated chip and tightly coupled together, it is assumed that the clocks drift together. Thus, the Δcp value may be used to adjust the phase of the aliased high band responses, HT1h($\omega_0 - \omega$) and HT2h($\omega_0 - \omega$), with respect to the digitizer clocks represented by HT3(ω). The Δt value represents the constant time difference between the HT4(ω) response and the HT3(ω) response. Thus, the two phase error values, Δt and Δcp, must be measured by the oscilloscope during run time or characterized as a function of temperature or humidity to determine the values during run time.

The above transfer functions (1) through (4) take into account the fact that in the HT3 and HT4 paths there are two overlaid transfer functions. That is, the aliased reversed high frequency band sits at the same frequency range as the low band.

The input signal low band and high band spectrums can be defined as:

$$XL = FFT(xL) \tag{5}$$

$$XH = FFT(xh) \tag{6}$$

For equation (7) below, an oscilloscope operation calibrates the timing of the digitizer pipe clocks and the LO such that a reference phase is known. The LO and the digitizer sample clocks are synchornized when the LO signal is obtained by applying a 6× frequency multiplier to one of the 12.5 GHz sample clocks of the digitizers 130 and 132. Then, during a runtime operation, a change in phase of Δφ can be measured and used as the delay correction factor. In equation (7), $t_d$ is the amount of time the LO drifted from the reference position, and $T_{LO}$ is the period of the LO.

$$\Delta\varphi = \frac{2 \cdot \pi \cdot t_d}{T_{LO}} \quad (7)$$

Now, complex exponential terms for performing high band pass correction may be added. This corrects the hardware LO drift that is primarily caused by changes in temperature.

$$Y1(\omega) = H11(\omega) \cdot XL(\omega) + H12(\omega) \cdot e^{j \cdot \Delta\varphi} \cdot XH(\omega_0 - \omega) \quad (8)$$

$$Y2(\omega) = H21(\omega) \cdot XL(\omega) \cdot e^{j \cdot \omega \cdot \Delta t} + H22(\omega) \cdot e^{j(\Delta\varphi + \omega \cdot \Delta t)} \cdot XH(\omega_0 - \omega) \quad (9)$$

$$\begin{bmatrix} Y1 \\ Y2 \end{bmatrix} = \begin{bmatrix} H11 & H11 \cdot e^{j \cdot \Delta\varphi} \\ H21 \cdot e^{j \cdot \omega \cdot \Delta t} & H22 \cdot e^{j(\Delta\varphi + \omega \cdot \Delta t)} \end{bmatrix} \cdot \begin{bmatrix} XL \\ \widetilde{XH} \end{bmatrix} \quad (10)$$

Where $$\widetilde{XH}(\omega) = H(\omega_0 - \omega) \quad (11)$$

The solution to solve for the XL and $\widetilde{XH}$ signals can be written as shown in equation (12):

$$\begin{bmatrix} XL \\ \widetilde{XH} \end{bmatrix} = \begin{bmatrix} H11 & H12 \cdot e^{j \cdot \Delta\varphi} \\ H21 \cdot e^{j \cdot \omega \cdot \Delta t} & H22 \cdot e^{j(\Delta\varphi + \omega \cdot \Delta t)} \end{bmatrix}^{-1} \cdot \begin{bmatrix} Y1 \\ Y2 \end{bmatrix} \quad (12)$$

The inverse of the matrix in equation (12) is computed and filled in as follows:

$$\begin{bmatrix} XL \\ \widetilde{XH} \end{bmatrix} = \begin{bmatrix} \frac{H22}{H11 \cdot H22 - H21 \cdot H12} & \frac{-H12 \cdot e^{j \cdot \Delta\varphi}}{\left(\frac{H11 \cdot H22 - }{H21 \cdot H12}\right)} \\ \frac{-H21 \cdot e^{j \cdot \omega \cdot \Delta t}}{\left(\frac{H11 \cdot H22 - }{H21 \cdot H12}\right) \cdot e^{j(\Delta\varphi + \omega \cdot \Delta t)}} & \frac{H11}{\left(\frac{H11 \cdot H22 - }{H21 \cdot H12}\right) \cdot e^{j(\Delta\varphi + \omega \cdot \Delta t)}} \end{bmatrix} \quad (13)$$

The matrix solution in equation (13) may then be shown in the frequency domain and represented as the four different filters in the matrix that must be applied to the y1 and y2 output signals from the two 8×8 MIMOs 200 and 202 at the two digitizer outputs 134 and 136, respectively.

The four filters 204, 206, 208, and 210 are represented as h1, h2, h3, and h4 in the time domain and are computed as follows:

$$h1 = IFFT\left[\frac{H22 \cdot BW}{H11 \cdot H22 - H21 \cdot H12}\right] \quad (14)$$

$$h2 = IFFT\left[\frac{-H12 \cdot BW \cdot e^{-j \cdot \omega \cdot \Delta t}}{H11 \cdot H22 - H21 \cdot H12}\right] \quad (15)$$

$$h3 = IFFT\left[\frac{-H21 \cdot BW \cdot e^{-j \cdot \Delta\varphi}}{H11 \cdot H22 - H21 \cdot H12}\right] \quad (16)$$

$$h4 = IFFT\left[\frac{H11 \cdot BW \cdot e^{-j(\Delta\varphi + \omega \cdot \Delta t)}}{H11 \cdot H22 - H21 \cdot H12}\right] \quad (17)$$

An additional BW filter (not shown) is applied to the transfer functions in equations (14), (15), (16), and (17). The BW filter is used as a crossover shaping filter. In addition, the stop band stomps down excessive gain and image are above the cross over region.

Thus, the output signal, x out, is represented as the sum of the recovered low band and the recovered high band. The value of $\varphi_0$ is the calibrated value of the hardware mixer LO determined by a signal path compensation (SPC) measurement inside the oscilloscope at the user's request. As discussed in more detail, a mode block 230 selects operating the oscilloscope 200 in either runtime mode or an SPC mode. The value of $\omega_0$ is the LO frequency. In this example, the LO frequency is 75 GHz.

Figure 6A:
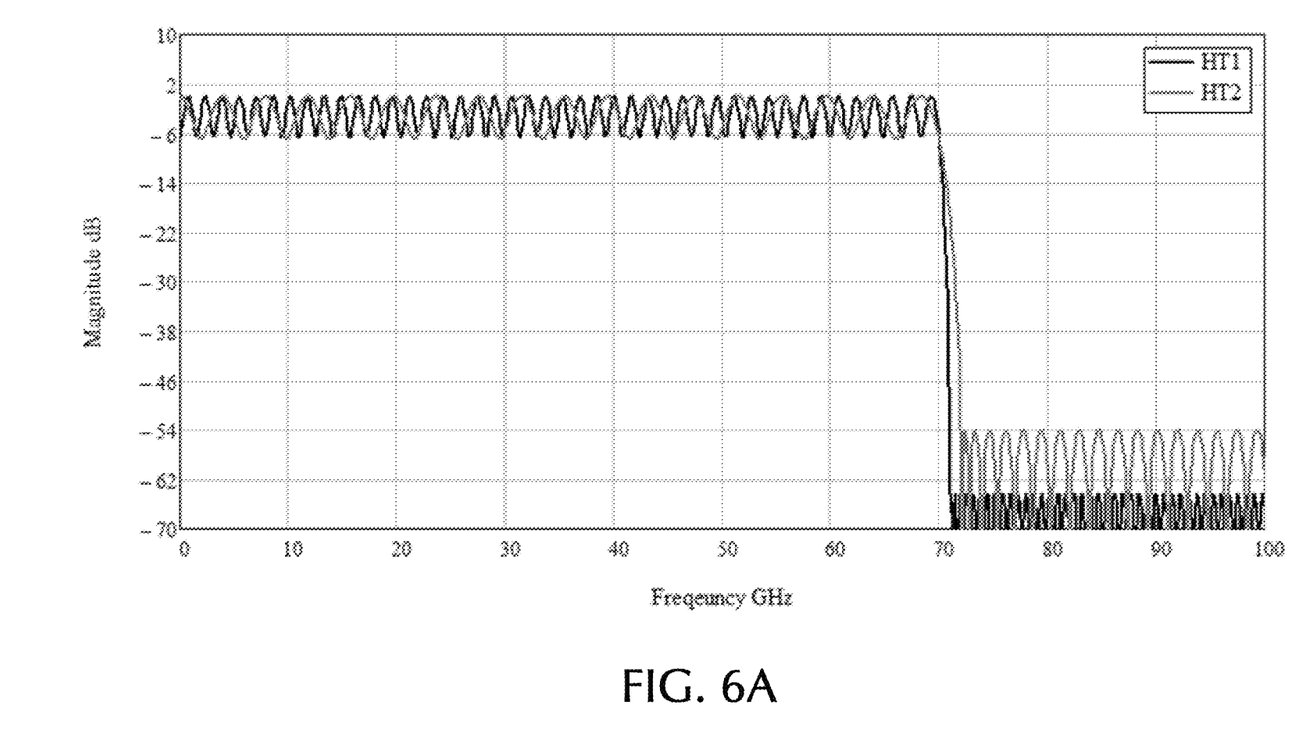
FIGS. 6A-B illustrate a simulated non-ideal transfer function for embodiments of the disclosed technology.
Figure 6B:
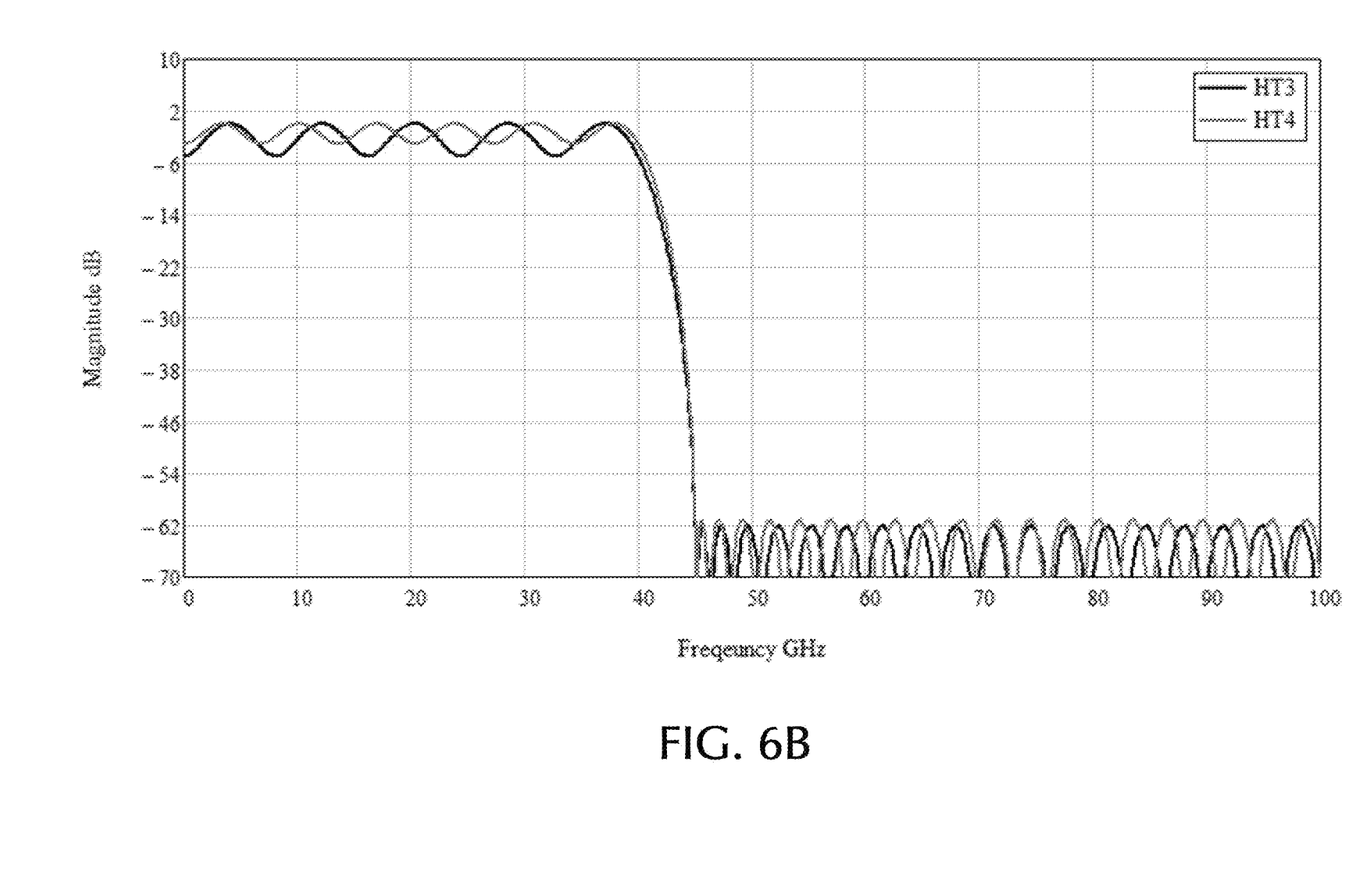
Figure 7:
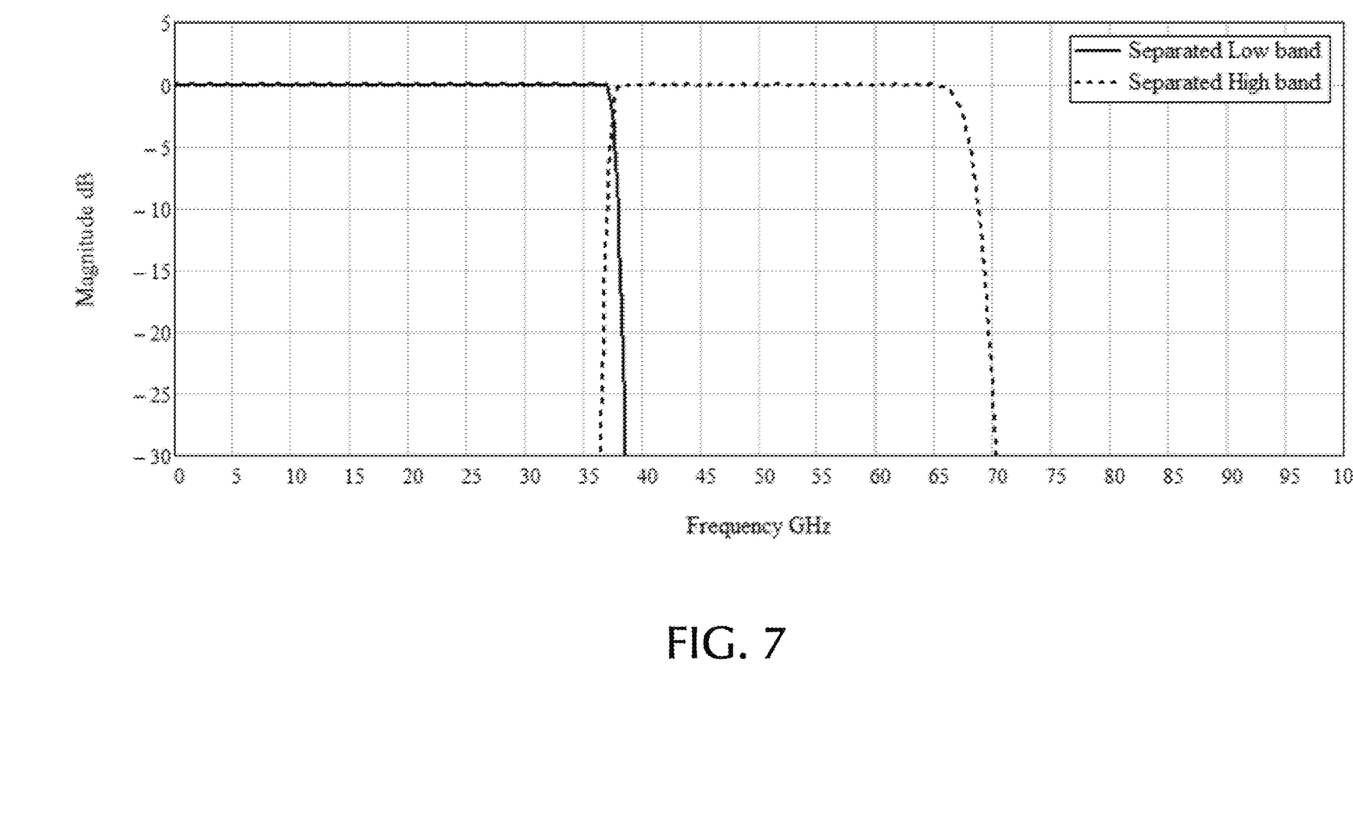
FIG. 7 illustrates the filtered separate high and low band according to embodiments of the disclosed technology.

FIGS. 6A-B illustrate an example of four simulated non-ideal transfer functions for the hardware, discussed above, and represented as HT1, HT2, HT3, and HT4. FIG. 7 represents the recovered and separated high band and low band after applying filters h1, h2, h3, and h4 to the digitized signal y1 and y2, as discussed in more detail below. The processing to obtain the separated bands also includes interpolation by 2×. It also includes the mixer 224 applied to the aliased high band that was recovered from the summed output of filters h3 and h4. Thus, the magnitude of the system is corrected to an ideal flat response. The non-ideal phase response of the system is also corrected such that the final system response is linear, and such that phase deviation caused by LO drive is also corrected. In addition, the time delay, $\Delta t$, between the digitizers 130 and 132, is also corrected.

Figure 8:
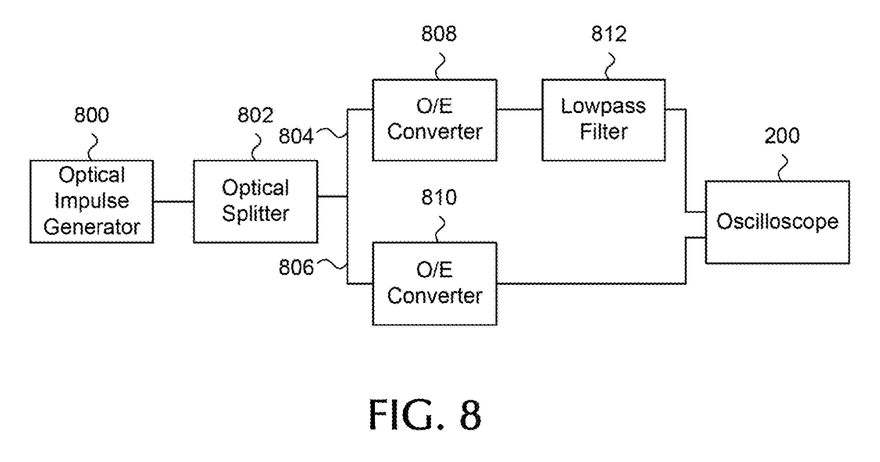
FIG. 8 is a block diagram of two step source calibration setup.

The measured H11, H12, H21, and H22 transfer parameters using the setup seen in FIG. 8 during manufacture and then are stored in the calibration block 212. The setup includes an optical impulse generator 800 connected to an optical splitter 802. The two outputs 804 and 806 of the optical splitter 802 are each sent to an optical-to-electrical (O/E) converter 808 and 810. The output from O/E converter 808 is sent directly to the oscilloscope 200, while the output from O/E converter 810 is sent through a 37.5 GHz lowpass filter 512 before being sent to the oscilloscope 200.

Let:

YL1 represent an acquisition response thru the oscilloscope with the 37.5 GHz filter 812 from digitizer 130.

YL2 represent an acquisition response thru the oscilloscope with the 37.5 GHz filter 812 from digitizer 132.

YF represent an acquisition with the full bandwidth impulse from digitizer 130.

YF2 represent an acquisition with the full bandwidth impulse from digitizer 132.

$XL_{imp}$ represents the bandwidth limited impulse.

$XF_{imp}$ represents the full bandwidth input impulse.

$XFh_{imp}$ represents the high band impulse to the ATI input of the oscilloscope 200.

$XFL_{imp}$ represents the low band impulse to the ATI input of the oscilloscope 200.

$HL_{imp}$ represents the frequency response of the lowpass impulse of the optical impulse generator 800.

$HF_{imp}$ represents the full frequency response of the full bandwidth of the optical impulse generator 800.

First, the bandwidth limited impulse $XL_{imp}$ is applied to the input and YL1 and YL2 are acquired. Since this is a limited bandwidth limited impulse, the high band signal is zero. So, equation (10) above can be written as:

$$\begin{bmatrix} YL1 \\ YL2 \end{bmatrix} = \begin{bmatrix} H11 \cdot XL_{imp} \\ H21 \cdot XL_{imp} \end{bmatrix} \quad (18)$$

Therefore, $$H11 = \frac{YL1}{XL_{imp}} \quad (19)$$

$$H21 = \frac{YL2}{XL_{imp}} \quad (20)$$

The second step is to apply the full bandwidth impulse $XF_{imp}$ to the input and acquire YF and YF2. For the elements in equation (10), the phase correction is set to zero for this part of the calibration and it is assumed that the SPC value of the phase reference will be in use at the time of calibration. Now equation (10) becomes:

$$\begin{bmatrix} YF1 \\ YF2 \end{bmatrix} = \begin{bmatrix} H11 & H12 \\ H21 & H22 \end{bmatrix} \cdot \begin{bmatrix} XFL_{imp} \\ XF\tilde{h}_{imp} \end{bmatrix} \quad (21)$$

Now, H11 and H21 have been measured and YF and YF2 have been acquired. The values of $XFL_{imp}$ and $XF\tilde{h}_{imp}$ are found by applying a lowpass filter to $XF_{imp}$ and highpass filter to $XF_{imp}$ and then:

$$XF\tilde{h}_{imp}(\omega) = XF\tilde{h}_{imp}(\omega_0 - \omega) \quad (22)$$

The two unknowns are H12 and H22. They can be solved for using the following equations:

$$YF1 = H11 \cdot XFL_{imp} + H12 \cdot XF\tilde{h}_{imp} \quad (23)$$

$$YF2 = H21 \cdot XFL_{imp} + H22 \cdot XF\tilde{h}_{imp} \quad (24)$$

Equation (23) can be solved for H12 as follows:

$$H12 = \frac{YF1 - H11 \cdot XFL_{imp}}{XF\tilde{h}_{imp}} \quad (25)$$

Equation (24) can be solved for H22 as follows:

$$H22 = \frac{YF2 - H21 \cdot XFL_{imp}}{XF\tilde{h}_{imp}} \quad (26)$$

Thus, H11 is defined by equation (19) and H21 is defined by equation (20), while H12 is defined by equation (25) and H22 is defined by equation (26). Initially, YL1, YL2, and $XL_{imp}$ are acquired and inputted into equations (19) and (20) to obtain H11 an H21. Then, all the measured and computed values can be substituted into equations (25) and (26) to obtain H12 and H22, respectively. As stated above, these values are then sent to the filter computation algorithm block 214 in FIG. 4 to compute the filter coefficients for the band separation filters 204, 206, 208, and 210.

The disclosed technology, however, is not limited to the calibration procedure described above for H11, H12, H21, and H22. The calibration equation may be derived to take into account a return loss between the optical impulse generator 800 and the oscilloscope 200 input. This would involve performing vector network analysis measurements to obtain S-parameters for the reflection coefficients and expanding the equations above to include such measurements.

Returning to the band separation and phase magnitude correction filters 204, 206, 208, and 210, these four filters operate on the two digitized output waveforms y1 and y2, as seen in FIG. 4. The filters 204, 206, 208, and 210 separate the low band from the aliased high band at the base sample rate of 100 GS/s prior to the final waveform reconstruction at 200 GS/s. The recovered high band, however, is still aliased. Both low and high bands are corrected for phase and magnitude errors due to the path mismatch for each mixer 110 and 112 and digitizer 130 and 132. That is, the band separation is performed after the signals have been digitized.

At this point, the four filters 204, 206, 208, 210 are applied and the high band can be up-converted and the values of xL and xh can be recovered.

The output signal y1 is filtered through filters h1 and h3, while the output signal y2 is filtered through filters h2 and h4. The outputs from filters 204 and 206 are then summed together via a summer 218 to obtain the low band xL. The output of filters 208 and 210 are summed together via a summer 220 to obtain the aliased high band xh. The filters 204, 206, 208, and 210 are analogous to a 2×2 MIMO except instead of operating on two separate sample pipes, they are operating on two signals with overlaid bands and separating those two bands into two different signal outputs. Thus, the filters 204, 206, 208, and 210 have a similar structure to a MIMO but have a different functionality.

The variable $\tilde{xh}$ represents the aliased high band of the input signal. A separate interpolation and mixing step is required to obtain xh from $\tilde{xh}$.

$$xl = h1 * y1 + h2 * y2 \quad (27)$$

$$\tilde{xh} = h3 * y1 + h4 * y2 \quad (28)$$

The aliased high band $\tilde{xh}$ and the low band xL are interpolated through a 2× interpolators 222 and 223 in order to increase the sample rate from 100 GS/s to 200 GS/s, as discussed above. The interpolators 222 and 223 allow the aliased high band to be frequency shifted back to its original position.

The variables xl and $\tilde{xh}$ are interpolated by 2× factor to increase the sample rate to allow high and low bands to be added back together without aliasing.

$$xL = \uparrow xl \quad (29)$$

$$\widetilde{xH} = \uparrow \tilde{xh} \quad (30)$$

After the aliased high band $\tilde{xh}$ is interpolated through interpolator 223, the high band is multiplied through multiplier 224 by cos(ω+φ), where ω is the LO frequency and φ is the phase needed to make ω consistent with the hardware mixers 110 and 112, to determine the high band xh.

The interpolated high band $\widetilde{xH}$ and the interpolated low band xL are then summed together by a summer 226. At this point, the band separation filters 204, 206, 208, and 210 have provided phase magnitude corrected outputs. However, the crossover region may still have errors.

The final signal reconstruction is then computed as follows:

$$xout = xL + \widetilde{xH} \cdot \cos(\omega_0 t + \varphi_0) * h_{lp} \quad (31)$$

where $h_{lp}$ is a low pass filter 232 at 70 GHz to remove unwanted images.

To correct the errors of the crossover region, a BWE enhancement filter 216 is used. Since the region to be corrected of the reconstructed waveform is just in the crossover region from 33 to 40 GHz, the BWE may be as small as 11 samples in length. As discussed above, the prior art system shown in FIG. 1 requires correcting the full frequency range of the reconstructed waveform, the BWE filter 172 had to be 4,000 samples long at 200 GS/s. The final reconstructed output waveform 232 is outputted from the BWE filter 216, which is computed as follows:

$$x_{bwe}\text{out} = x\text{out} * bwe \quad (32)$$

As seen in FIG. 4, the system also includes an LO phase measurement block 228. The output from the LO phase measurement block is inputted into the mode selection block 230, which selects whether to run the oscilloscope in SPC mode or runtime mode. During the runtime mode, the filters 204, 206, 208, and 210 are calculated. SPC is an operation that the oscilloscope performs when requested by a user. The oscilloscope stops the normal runtime acquisitions and performs algorithms internally to calibrate the oscilloscope signal paths. That is, a new phase measurement, $\varphi$, may be computed during the SPC operation.

The LO phase measurement block 228 determines the phase of the LO with respect to the digitizer sample clocks. This may be done by reading temperature sensors in the scope and assigning a phase based on the temperature. It may also be done by extra hardware that injects a signal into the acquisition at the crossover region and determines a change in phase from the injection. The SPC operation has the ability to set the phase to a known reference point. Accordingly, either a reference phase determined at SPC and stored in memory 234 may be used or a change in phase value measured during run time may be used.

The filters, the mixers, harmonic signals, the combiners/summers, discussed above, and other associated elements can be implemented digitally. For example, a digital signal processor (DSP), microprocessor, programmable logic device, general purpose processor, or other processing system with appropriate peripheral devices as desired can be used to implement the functionality of the processing of the digitized signals. Any variation between complete integration to fully discrete components can be used to implement the functionality.

Although embodiments have been described above where digitized signals can be substantially immediately processed, such processing after digitization can be deferred as desired. For example, the digitized data from digitizers 130 and 132 can be stored in a memory for subsequent processing.

In some embodiments, two paths are implemented. However, any number of paths may be used. If more than two paths are implemented, the splitter 102 will split the incoming signal 104 into the required number of paths. Then formulas may be derived for the necessary band separation filters, using the above equations.

Moreover, although the digital filtering, mixing, and combining have been described as discrete operations, such operations can be combined, incorporated into other functions, or the like. In addition, as the above discussion assumed ideal components, additional compensation can be introduced into such processing as appropriate to correct for non-ideal components. Furthermore, when processing the digitized signals, changing frequency ranges, mixing, and the like can result in a higher sample rate to represent such changes. The digitized signals can be upsampled, interpolated, or the like as appropriate.

Another embodiment includes computer readable code embodied on a computer readable medium that, when executed, causes the computer to perform any of the above-described operations. As used here, a computer is any device that can execute code. Microprocessors, programmable logic devices, multiprocessor systems, digital signal processors, personal computers, or the like are all examples of such a computer. In some embodiments, the computer readable medium can be a tangible computer readable medium that is configured to store the computer readable code in a non-transitory manner.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

The invention claimed is:

1. A test and measurement instrument, comprising:
    a splitter configured to split an input signal into at least two split signals, each split signal including substantially the entire bandwidth of the input signal;
    at least two harmonic mixers, each harmonic mixer configured to mix an associated split signal of the at least two split signals with an associated harmonic signal to generate an associated mixed signal;
    at least two digitizers, each digitizer configured to digitize the associated mixed signal of an associated harmonic mixer of the at least two harmonic mixers;
    at least two multiple input multiple output (MIMO) polyphase filter arrays, each MIMO polyphase filter array configured to filter the associated digitized mixed signal of an associated digitizer of the at least two digitizers;
    at least two pairs of band separation filters configured to receive the associated digitized mixed signals from each of the multiple input multiple output polyphase filter arrays and to separate and output a low band of the input signal and a high band of the input signal based on a time difference between the at least two digitizers and a phase drift of a local oscillator; and
    a combiner configured to combine the low band of the input signal and the high band of the input signal to form a reconstructed input signal.

2. The test and measurement instrument of claim 1, wherein each MIMO polyphase filter array is an 8×8 MIMO polyphase filter array.

3. The test and measurement instrument of claim 1, further comprising a bandwidth enhance filter configured to filter the reconstructed input signal.

4. The test and measurement instrument of claim 1, further comprising:
    a first summer associated with a first group of the at least two pairs of band separation filters configured to output the low band of the input signal, the first summer configured to combine the outputs of each of the first group of the at least two pairs of band separation filters to form the low band of the input signal; and
    a second summer associated with a second group of the at least two pairs of band separation filters configured to output the high band of the input signal, the second summer configured to combine the outputs of each of the second group of the at least two pairs of band separation filters to form the high band of the input signal.

5. The test and measurement instrument of claim 4, wherein the high band output from the at least two pairs of band separation filters is an aliased high band, the test and measurement instrument further comprising a high band multiplier configured to multiple the aliased high band by a signal to convert the aliased high band to a non-aliased high band, wherein the combiner combines the low band and the non-aliased high band to form the reconstructed input signal.

6. The test and measurement instrument of claim 5, further comprising an interpolator configured to interpolate each of the low band and the aliased high-band prior to multiplying the aliased high band by the signal to convert the aliased high band to the non-aliased high band.

7. The test and measurement instrument of claim 1, further comprising a filter computation unit configured to compute filter coefficients for each of the at least two pairs of band separation filters.

8. A method, comprising:
splitting an input signal into at least two split signals, each split signal including substantially the entire bandwidth of the input signal;
mixing each split signal with an associated harmonic signal to generate an associated mixed signal;
digitizing each of the associated mixed signals;
filtering each digitized mixed signal through an associated multiple input multiple output (MIMO) polyphase filter array;
filtering by at least two pairs of band separation filters the digitized mixed signal from each of the MIMO polyphase filter array based on a time difference between the at least two digitizers and a phase drift of a local oscillator;
outputting from the at least two pairs of band separation filters a low band of the input signal and a high band of the input signal; and
combining the low band of the input signal and the high band of the input signal to form a reconstructed input signal.

9. The method of claim 8, wherein each MIMO polyphase filter array is an 8×8 MIMO polyphase filter array.

10. The method of claim 8, further comprising filtering the reconstructed input signal through a bandwidth enhance filter.

11. The method of claim 8, further comprising:
combining the outputs of each of a first group of the at least two pairs of band separation filters configured to output the low band of the input signal to form the reconstructed low band of the input signal; and
combining the outputs of each of a second group of the at least two pairs of band separation filters configured to output the high band of the input signal to form the reconstructed high band of the input signal.

12. The method of claim 11, wherein the reconstructed high band output from the combiner is an aliased high band, the method further comprising multiplying the aliased reconstructed high band by a signal to convert the aliased reconstructed high band to a non-aliased reconstructed high band, wherein combining the low band of the input signal and the high band of the input signal to form a reconstructed input signal includes combining the reconstructed low band and the non-aliased reconstructed high band to form the reconstructed input signal.

13. The method of claim 12, further comprising interpolating each of the reconstructed low band and the aliased reconstructed high-band prior to multiplying the aliased reconstructed high band by the signal to convert the aliased reconstructed high band to the non-aliased reconstructed high band.

14. The method of claim 8, further comprising computing filter coefficients for each of the at least two pairs of band separation filters.

* * * * *